(12) United States Patent
Han et al.

(10) Patent No.: US 12,184,268 B2
(45) Date of Patent: Dec. 31, 2024

(54) GATE DRIVE CIRCUIT AND DRIVE METHOD FOR POWER SEMICONDUCTOR DEVICE

(71) Applicant: Innovision Semiconductor Inc., Dongguan (CN)

(72) Inventors: Feng Han, Shanghai (CN); Xuening Li, Dongguan (CN); Wanke Tao, Chongqing (CN)

(73) Assignee: Innovision Semiconductor Inc., Dongguan (CN)

( * ) Notice: Subject to any disclaimer, the term of this patent is extended or adjusted under 35 U.S.C. 154(b) by 28 days.

(21) Appl. No.: 18/359,285

(22) Filed: Jul. 26, 2023

(65) Prior Publication Data

US 2024/0405761 A1   Dec. 5, 2024

(30) Foreign Application Priority Data

Jun. 2, 2023   (CN) .......................... 202310646462.X

(51) Int. Cl.

| H03K 17/041 | (2006.01) |
| H01L 29/40 | (2006.01) |
| H01L 29/423 | (2006.01) |
| H01L 29/78 | (2006.01) |

(52) U.S. Cl.
CPC ...... *H03K 17/04106* (2013.01); *H01L 29/407* (2013.01); *H01L 29/42368* (2013.01); *H01L 29/7813* (2013.01); *H01L 29/7816* (2013.01); *H01L 29/7831* (2013.01); *H03K 2217/0063* (2013.01); *H03K 2217/0072* (2013.01)

(58) Field of Classification Search
CPC ..... H03K 17/04106; H03K 2217/0063; H03K 2217/0072
See application file for complete search history.

(56) References Cited

U.S. PATENT DOCUMENTS

| 5,561,393 A * | 10/1996 | Sakurai ............... | H01L 29/7395 257/E29.198 |
| 7,868,353 B2 * | 1/2011 | Machida ............. | H01L 27/0727 257/192 |
| 9,595,948 B2 * | 3/2017 | Akiyama ............... | H03K 17/28 |
| 9,853,637 B1 * | 12/2017 | Meiser ................... | H03K 17/18 |
| 11,736,104 B2 * | 8/2023 | Kinoshita .............. | H03K 17/18 327/109 |

(Continued)

*Primary Examiner* — William Hernandez
(74) *Attorney, Agent, or Firm* — Renner, Otto, Boisselle & Sklar, LLP

(57) ABSTRACT

A gate drive circuit for a power semiconductor device, a low-side switching circuit, a high-side switching circuit, and a drive method are disclosed. When a first gate driver receives a control signal which is at a first level, the first gate driver connects a first gate to a first voltage, so that the first gate controls a channel region. When the transistor operates on a Miller plateau, the area of an overlapping region between the first gate and a drain inside the transistor is relatively small, so the Miller capacitance of the transistor is relatively small, thereby improving the switching speed of the transistor. A second gate is connected to a second voltage after a first duration, so that the second gate controls a drift region of the transistor to form an accumulation layer, and the accumulation layer has a relatively high carrier concentration.

10 Claims, 15 Drawing Sheets

(56) References Cited

U.S. PATENT DOCUMENTS

| | | | |
|---|---|---|---|
| 2003/0173619 A1* | 9/2003 | Feldtkeller | H01L 29/7815 257/E29.264 |
| 2004/0135201 A1* | 7/2004 | Elbanhawy | H01L 29/7813 257/E29.256 |
| 2017/0250685 A1* | 8/2017 | Bina | H01L 29/7813 |

* cited by examiner

GATE DRIVE CIRCUIT AND DRIVE METHOD FOR POWER SEMICONDUCTOR DEVICE

CROSS-REFERENCE TO RELATED APPLICATION

This application is based on and claims the benefit of priority from Chinese Patent Application No. 202310646462X, filed on 2 Jun. 2023, the entirety of which is incorporated by reference herein.

TECHNICAL FIELD

The disclosure relates to the technical field of semiconductors and particularly relates to a gate drive circuit for a power semiconductor device, a low-side switching circuit, a high-side switching circuit, and a drive method.

BACKGROUND

Power MOSFETs have been widely used in power chips, motor drives, power amplifiers, and other fields due to their advantages such as high switching speed, high operating frequency, and low drive power consumption. However, the traditional power MOSFET, when in use, has a relatively large Miller capacitance, resulting in a relatively slow switching speed, or has a relatively high on-resistance, resulting in relatively large power consumption.

SUMMARY

The disclosure aims to at least solve one of the technical problems in the existing technology. For this reason, the disclosure proposes a gate drive circuit for a power semiconductor device, a low-side switching circuit, a high-side switching circuit, and a drive method, which can improve the switching speed of transistors can be improved, and reduce the on-resistance of the transistors.

Embodiments in the first aspect of the disclosure provide a gate drive circuit for a power semiconductor device, including a power semiconductor device, where the power semiconductor device is a transistor which is provided with a first gate and a second gate, the first gate and the second gate are not connected to each other, the second gate and a source of the transistor are not connected to each other, the first gate is disposed above a channel region of the transistor and is configured to control the channel region, and the second gate is disposed above a field oxide of the transistor and is configured to control a drift region of the transistor;

a first gate driver, where a control terminal of the first gate driver is configured to connect a control signal, a voltage input terminal of the first gate driver is connected to a first voltage, a voltage output terminal of the first gate driver is electrically connected to the first gate, and the first voltage is an operating voltage of the first gate; and a second gate driver, where a control terminal of the second gate driver is configured to connect the control signal, a voltage input terminal of the second gate driver is connected to a second voltage, a voltage output terminal of the second gate driver is electrically connected to the second gate, and the second voltage is an operating voltage of the second gate;

when the first gate driver receives the control signal which is at a first level, the first gate is connected to the first voltage to make the first gate control the channel region, so that in a first duration, the transistor first enters a Miller plateau, and then enters an ohmic region from the Miller plateau; and when the second gate driver receives the control signal which is at the first level, the second gate is connected to the second voltage after the first duration, so that the second gate controls the drift region of the transistor to form an accumulation layer.

The gate driving circuit for a power semiconductor device according to the embodiments of the disclosure at least has the following beneficial effects. When the first gate driver receives the control signal which is at the first level, the first gate driver connects the first gate to the first voltage, while the voltage of the second gate does not reach the operating voltage at this time. Only the voltage of the first gate of the transistor reaches the operating voltage, which makes the first gate control the channel region, so that when operating in the first duration, the transistor first enters the Miller plateau, and then enters the ohmic region from the Miller plateau. When the transistor operates on the Miller plateau, the area of an overlapping region between the first gate and the drain inside the transistor is relatively small, so the Miller capacitance of the transistor is relatively small, thereby improving the switching speed of the transistor. When the second gate driver receives the control signal which is at the first level, the second gate is connected to the second voltage after the first duration, and the voltage of the second gate reaches the operating voltage at this time, so that the second gate controls the drift region of the transistor to form the accumulation layer, and the accumulation layer has a relatively high carrier concentration to reduce resistance components in the drift region, thereby reducing the on-resistance of the transistor, so as to reduce the power consumption of the transistor. Therefore, by using the gate drive circuit for a power semiconductor device according to the embodiments of the disclosure, the switching speed of transistors can be improved, and the on-resistance of the transistors can be reduced.

According to some embodiments in the first aspect of the disclosure, the first duration is longer than or equal to 1 ns.

According to some embodiments in the first aspect of the disclosure, when the second gate driver receives the control signal which is at a second level, the second gate is disconnected from the second voltage; and when the first gate driver receives the control signal which is at the second level, the first gate is disconnected from the first voltage after a second duration.

According to some embodiments in the first aspect of the disclosure, the second duration is longer than or equal to 1 ns.

Embodiments in the second aspect of the disclosure provide a low-side switching circuit, including the gate drive circuit for a power semiconductor device of any one of the embodiments in the first aspect, where a source of the transistor is grounded, and a drain of the transistor is connected to an input voltage.

Embodiments in the third aspect of the disclosure provide a high-side switching circuit, including the gate drive circuit for a power semiconductor device described in any one of the embodiments in the first aspect, and further including a level shifter, where the control terminal of the first gate driver is connected to the control signal through the level shifter and the control terminal of the second gate driver is connected to the control signal through the level shifter.

According to some embodiments in the third aspect of the disclosure, the high-side switching circuit further includes a first bootstrap diode, a first bootstrap capacitor, a second bootstrap diode, and a second bootstrap capacitor, where an input terminal of the first bootstrap diode is connected to the first voltage, an output terminal of the first bootstrap diode is electrically connected to a positive terminal of the first bootstrap capacitor and the voltage input terminal of the first gate driver, respectively, a negative terminal of the first bootstrap capacitor is electrically connected to a high-voltage side floating power return terminal of the first gate driver, and the high-voltage side floating power return terminal of the first gate driver is electrically connected to the source of the transistor; the drain of the transistor is connected to the input voltage; and an input terminal of the second bootstrap diode is connected to the second voltage, an output terminal of the second bootstrap diode is electrically connected to a positive terminal of the second bootstrap capacitor and the voltage input terminal of the second gate driver, respectively, a negative terminal of the second bootstrap capacitor is electrically connected to a high-voltage side floating power return terminal of the second gate driver, and the high-voltage side floating power return terminal of the second gate driver is electrically connected to the source of the transistor.

Embodiments in the fourth aspect of the disclosure provide a gate drive method for a power semiconductor device, applied to the gate drive circuit for a power semiconductor device described in the embodiments in the first aspect, the drive method includes:

in response to the control signal which is at a first level being received, controlling the first gate driver to connect the first gate to the first voltage, so as to make the first gate control the channel region so that in a first duration, the transistor first enters a Miller plateau, and then enters an ohmic region from the Miller plateau; and controlling the second gate driver to connect the second gate to the second voltage after the first duration, so that the second gate controls the drift region of the transistor to form an accumulation layer.

According to some embodiments in the fourth aspect of the disclosure, the drive method further includes:

in response to the control signal which is at a second level being received, controlling the second gate driver to disconnect the second gate from the second voltage; and controlling the first gate driver to disconnect the first gate from the first voltage after a second duration.

According to some embodiments in the fourth aspect of the disclosure, the first duration is longer than or equal to 1 ns.

Additional aspects and advantages of the disclosure will be provided in part in the following description, and in part will be apparent from the following description, or learned by practice of the disclosure.

BRIEF DESCRIPTION OF DRAWINGS

The disclosure is further described below in conjunction with the accompanying drawings and embodiments.

DETAILED DESCRIPTION

Figure 1:
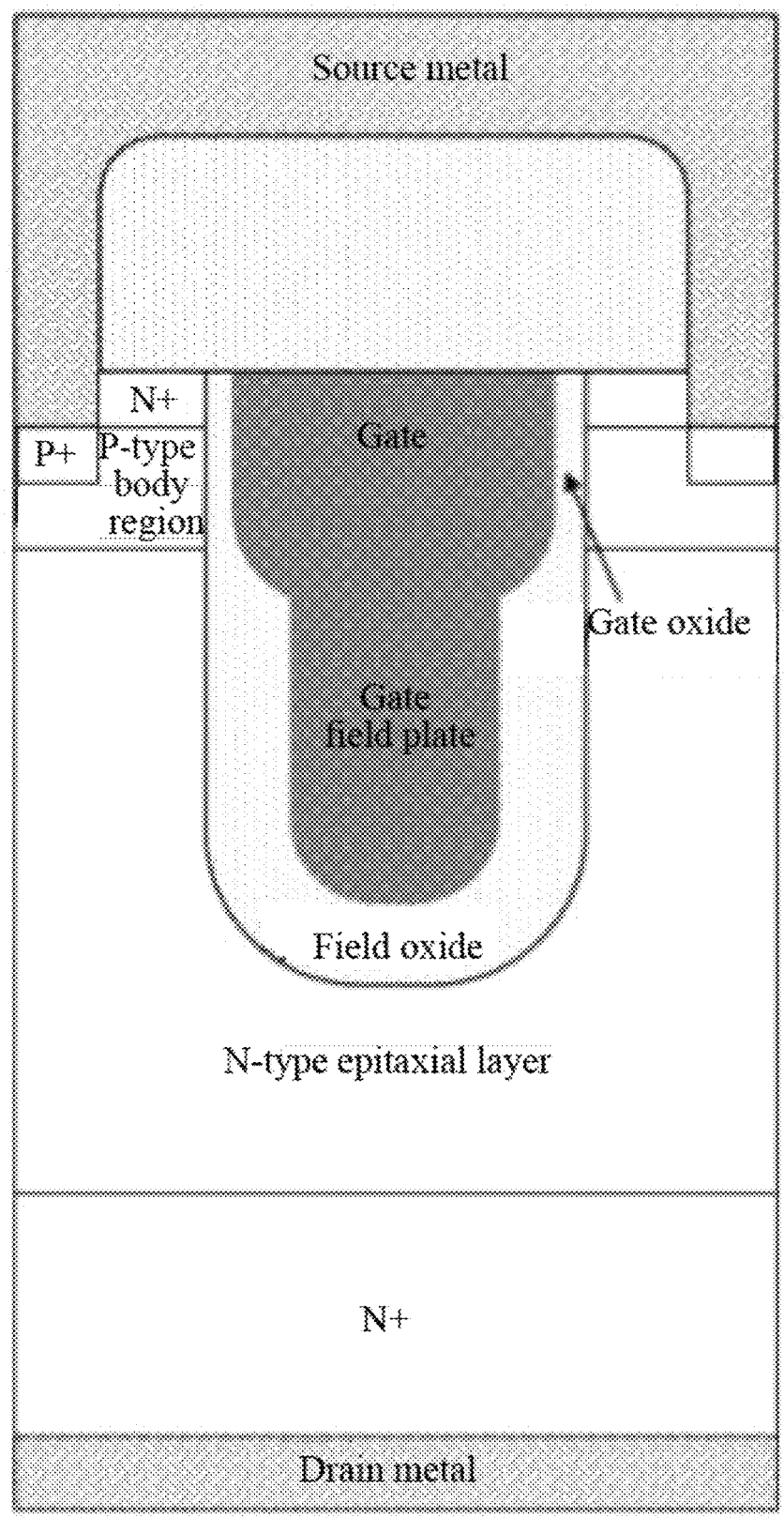
FIG. 1 is a schematic diagram of a vertical structure of a transistor using a field oxide and a gate field plate in the related art.

Embodiments of the disclosure are described in detail below, examples of which are shown in the accompanying drawings, where the same or similar reference numerals represent the same or similar elements or elements with the same or similar functions throughout. The following embodiments described by reference to the accompanying drawings are exemplary and are intended only to explain the disclosure, and are not to be construed as limiting the disclosure In the description of the disclosure, it is to be understood that, referring to orientation description, the orientation or positional relationships indicated by the terms such as upper, lower, front, rear, left, right, etc., are based on the orientation or positional relationships shown in the accompanying drawings, merely for ease of description of the disclosure and simplification for the description, rather than indicating or implying that the device or element referred to must have a specific orientation and be constructed and operated in a specific orientation, which, therefore, cannot be construed as limiting the disclosure.

In the description of the disclosure, several refers to one or more, multiple refers to two or more, greater than, less than, over, and the like are understood not to include the following number, and above, below, within, and the like are understood to include the following number. If described, first and second are only for the purpose of distinguishing technical features, and are not to be construed as indicating or implying relative importance or implicitly indicating the number of technical features indicated or implicitly indicating the precedence relationship of technical features indicated.

In the description of the disclosure, unless explicitly defined otherwise, providing, installing, connecting and other words should be understood broadly, and those having ordinary skills in the art can reasonably determine the specific meaning of the above words in the disclosure combined with the specific content of the technical solution.

In the description of the disclosure, description with reference to the terms such as "one embodiment", "some embodiments", "illustrative embodiments", "examples", "specific examples", or "some examples" implies that specific characteristics, structures, materials or features described in conjunction with the embodiments or examples are included in at least one embodiment or example of the disclosure. In the present specification, the schematic expression of the above terms does not necessarily refer to the same embodiment or example. Moreover, the specific characteristics, structures, materials, or features described can be combined in any one or more embodiments or examples in a suitable manner.

Figure 2:
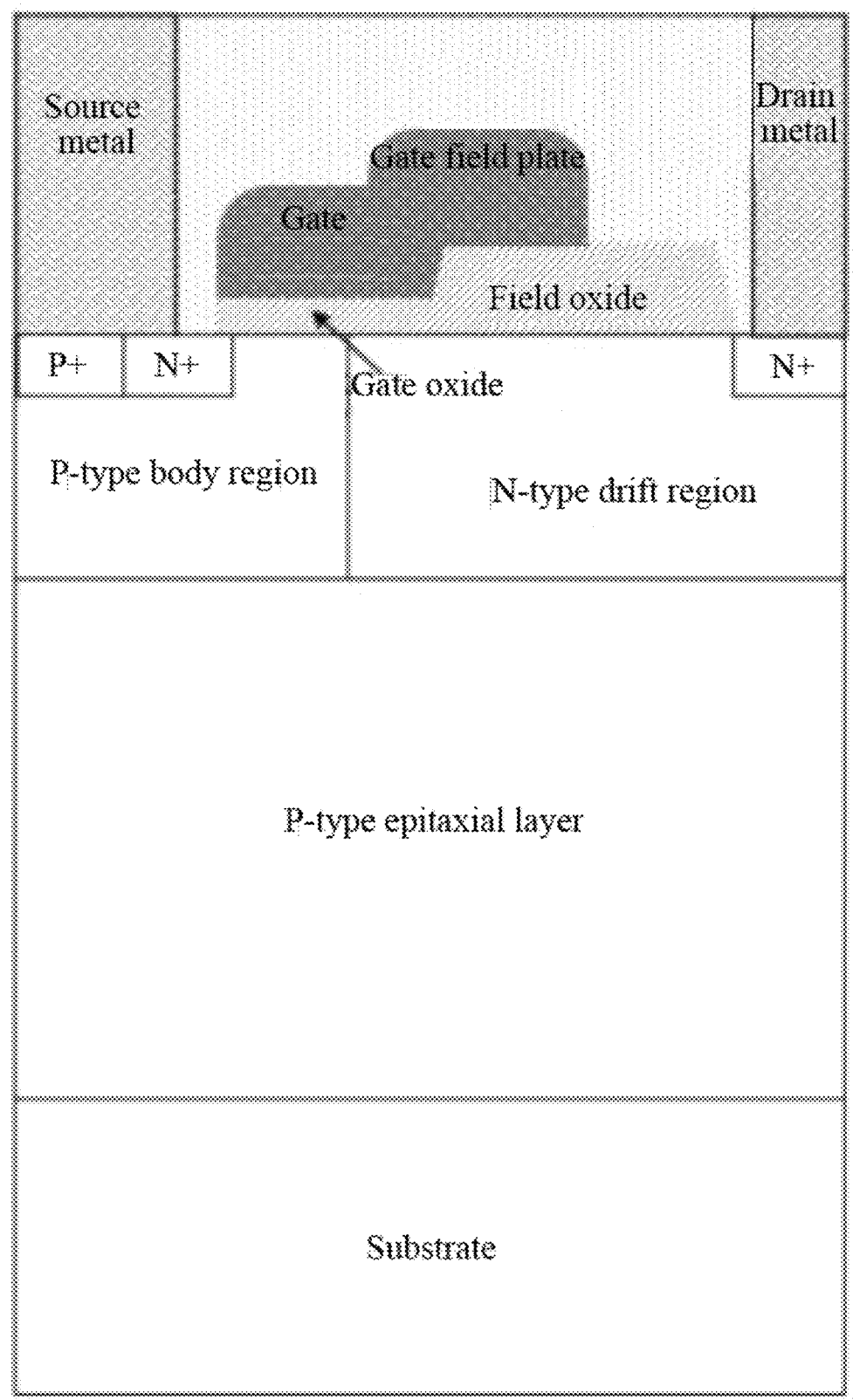
FIG. 2 is a schematic diagram of a lateral structure of the transistor using the field oxide and the gate field plate in the related art.
Figure 3:
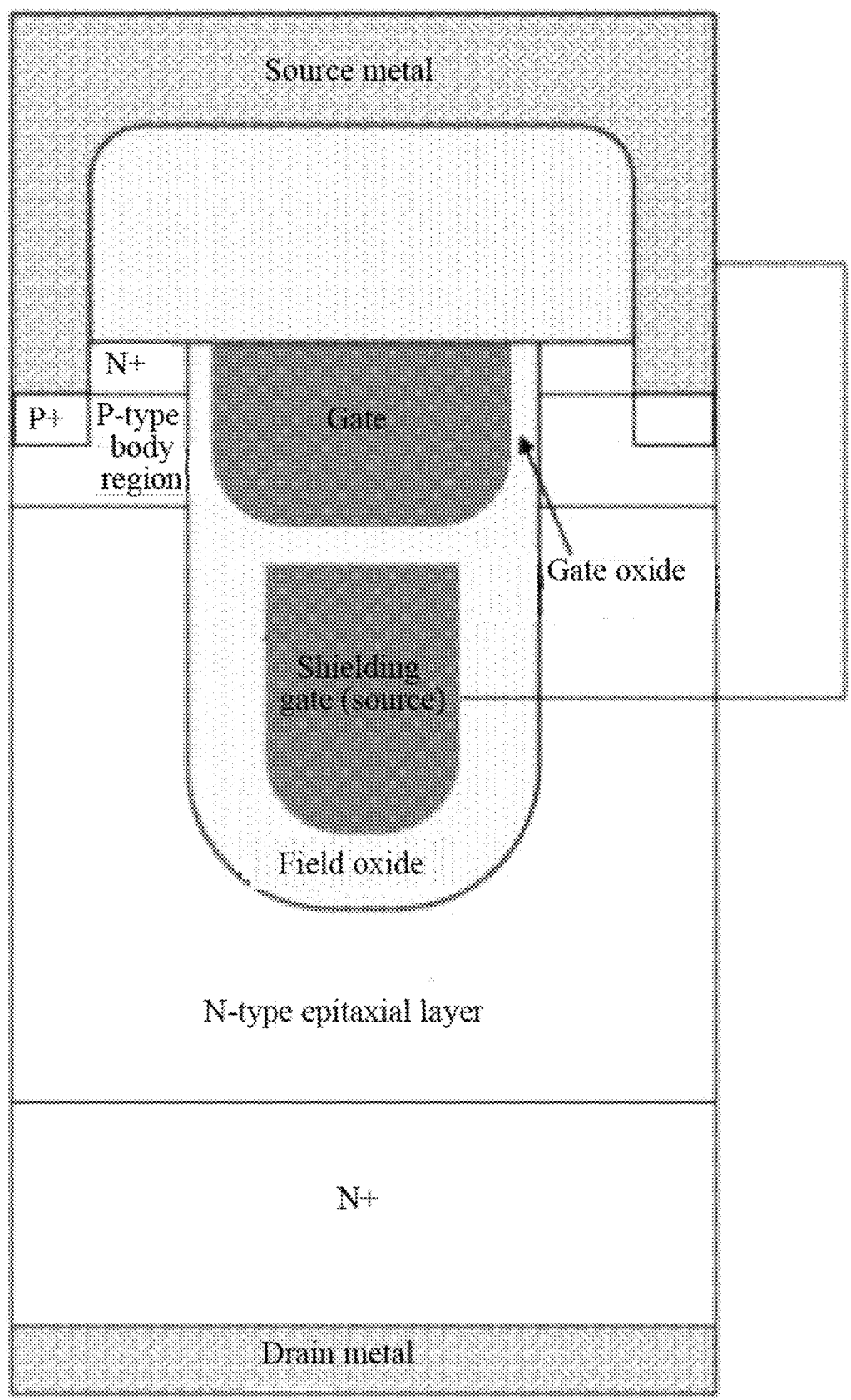
FIG. 3 is a schematic diagram of a vertical structure of a transistor using a shielding gate in the related art.
Figure 4:
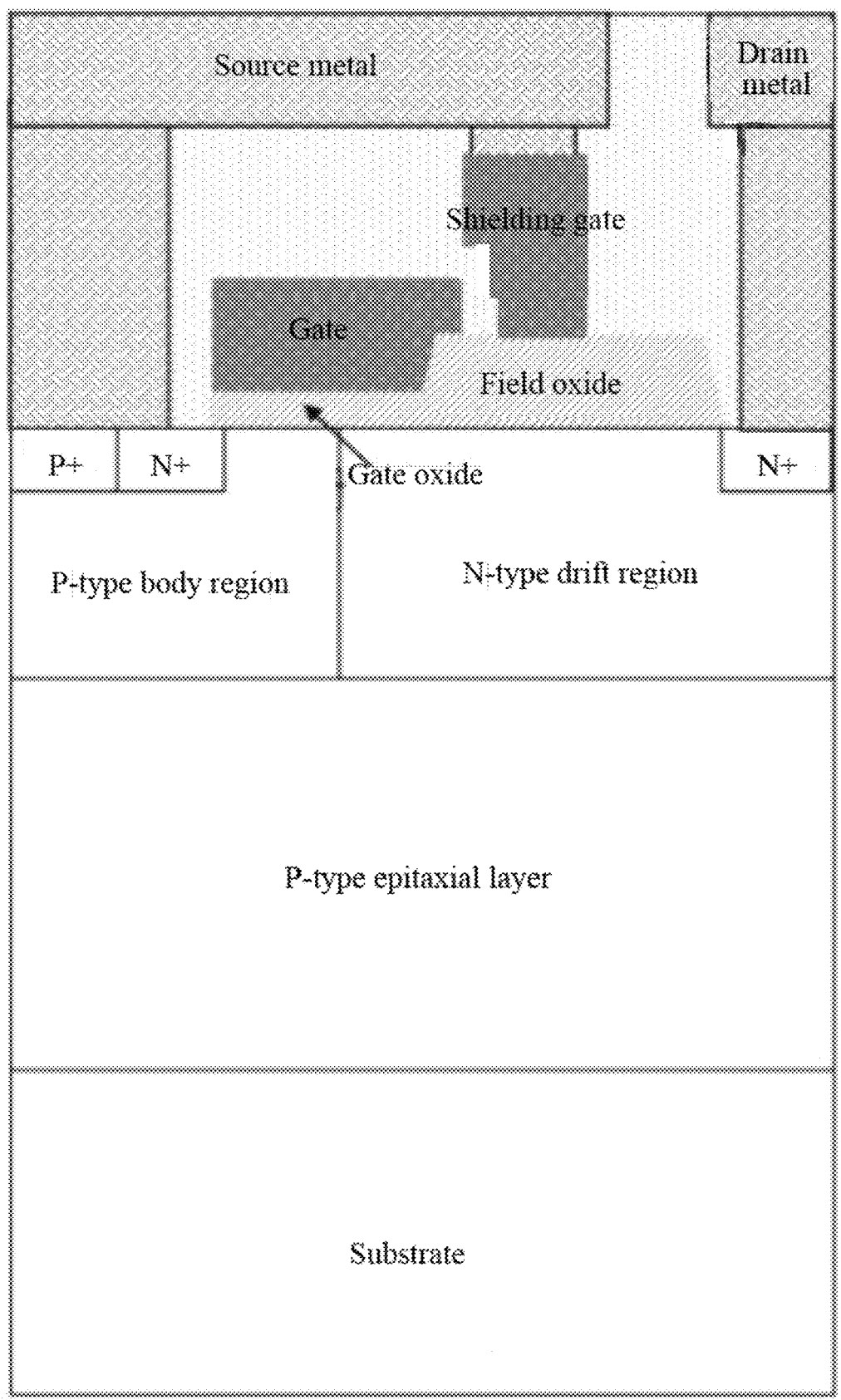
FIG. 4 is a schematic diagram of a lateral structure of the transistor using the shielding gate in the related art.

Referring to FIG. 1 and FIG. 2, which show the transistor structure using a field oxide and a gate field plate in the related art, FIG. 1 shows a vertical structure, FIG. 2 shows a lateral structure, and the transistor shown in FIG. 1 and FIG. 2 has good on-resistance and breakdown voltage. However, the Miller capacitance thereof is high and the switching speed is low, which is not conducive to the application of high-speed switching. Referring to FIG. 3 and FIG. 4, which show the transistor structure using a shielding gate, FIG. 3 shows a vertical structure, and FIG. 4 shows a lateral structure. In the transistor shown in FIG. 3 and FIG. 4, the shielding gate and source are short-circuited. This structure can effectively reduce the Miller capacitance, but its high on-resistance is not conducive to the application of large current. Based on the related art shown in FIG. 1 to FIG. 4, the embodiments of the disclosure provide a gate drive circuit for a power semiconductor device, a low-side switching circuit, a high-side switching circuit, and a drive method. Accordingly, the switching speed of transistors can be improved, and the on-resistance of transistors can be reduced.

Referring to FIG. 5 to FIG. 12, embodiments in the first aspect of the disclosure provide a gate drive circuit for a power semiconductor device, including:

a power semiconductor device, where the power semiconductor device is a transistor that is provided with a first gate G1 and a second gate G2, the first gate G1 and the second gate G2 are not connected to each other, the second gate G2 and a source of the transistor are not connected to each other, the first gate G1 is disposed above a channel region of the transistor and is configured to control the channel region, and the second gate G2 is disposed above a field oxide of the transistor and is configured to control a drift region of the transistor;

a first gate driver DRV1, where a control terminal of the first gate driver DRV1 is configured to connect a control signal, a voltage input terminal of the first gate driver DRV1 is connected to a first voltage, a voltage output terminal of the first gate driver DRV1 is electrically connected to the first gate G1, and the first voltage is an operating voltage of the first gate G1; and a second gate driver DRV2, where a control terminal of the second gate driver DRV2 is configured to connect the control signal, a voltage input terminal of the second gate driver DRV2 is connected to a second voltage, a voltage output terminal of the second gate driver DRV2 is electrically connected to the second gate G2, and the second voltage is an operating voltage of the second gate G2;

when the first gate driver DRV1 receives the control signal which is at a first level, the first gate G1 is connected to the first voltage to make the first gate G1 control the channel region, so that in a first duration, the transistor first enters a Miller plateau, and then enters an ohmic region from the Miller plateau; and when the second gate driver DRV2 receives the control signal which is at the first level, the second gate G2 is connected to the second voltage after the first duration, so that the second gate G2 controls the drift region of the transistor to form an accumulation layer.

The gate driving circuit for a power semiconductor device according to the embodiments of the disclosure at least has the following beneficial effects. When the first gate driver DRV1 receives the control signal which is at the first level, the first gate driver DRV1 connects the first gate G1 to the first voltage, while the voltage of the second gate G2 does not reach the operating voltage at this time. Only the voltage of the first gate G1 of the transistor reaches the operating voltage, which makes the first gate G1 control the channel region, so that when operating in the first duration, the transistor first enters the Miller plateau, and then enters the ohmic region from the Miller plateau. When the transistor operates on the Miller plateau, the area of an overlapping region between the first gate G1 and the drain inside the transistor is relatively small, so the Miller capacitance of the transistor is relatively small, thereby improving the switching speed of the transistor. When the second gate driver DRV2 receives the control signal which is at the first level, the second gate G2 is connected to the second voltage after the first duration, and the voltage of the second gate G2 reaches the operating voltage at this time, so that the second gate G2 controls the drift region of the transistor to form the accumulation layer, and the accumulation layer has a relatively high carrier concentration to reduce resistance components in the drift region, thereby reducing the on-resistance of the transistor, so as to reduce the power consumption of the transistor. Therefore, by using the gate drive circuit for a power semiconductor device according to the embodiments of the disclosure, the switching speed of transistors can be improved, and the on-resistance of transistors can be reduced.

Figure 5:
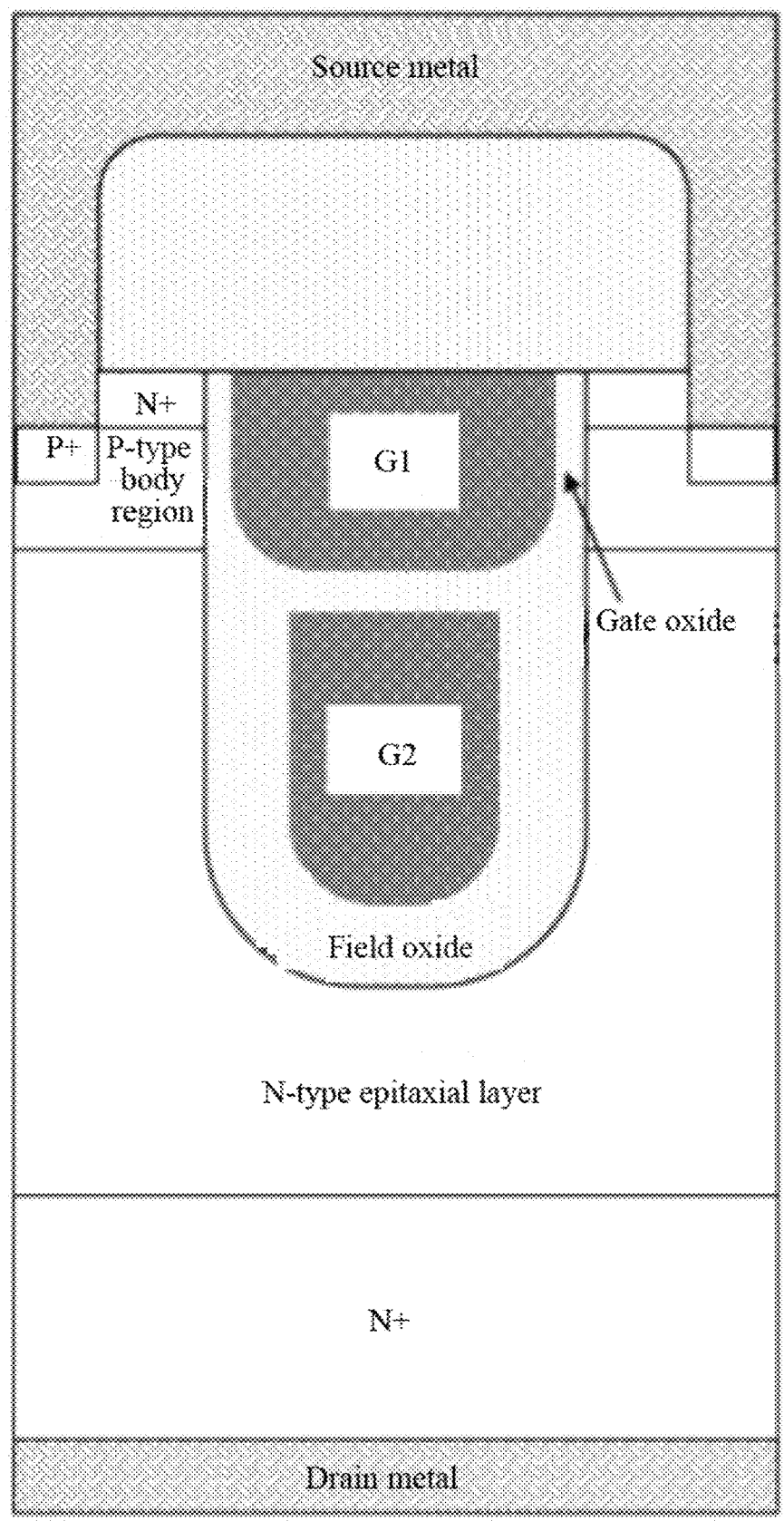
FIG. 5 is a schematic structural diagram of a vertical trench of a transistor according to the embodiments of the disclosure.
Figure 6:
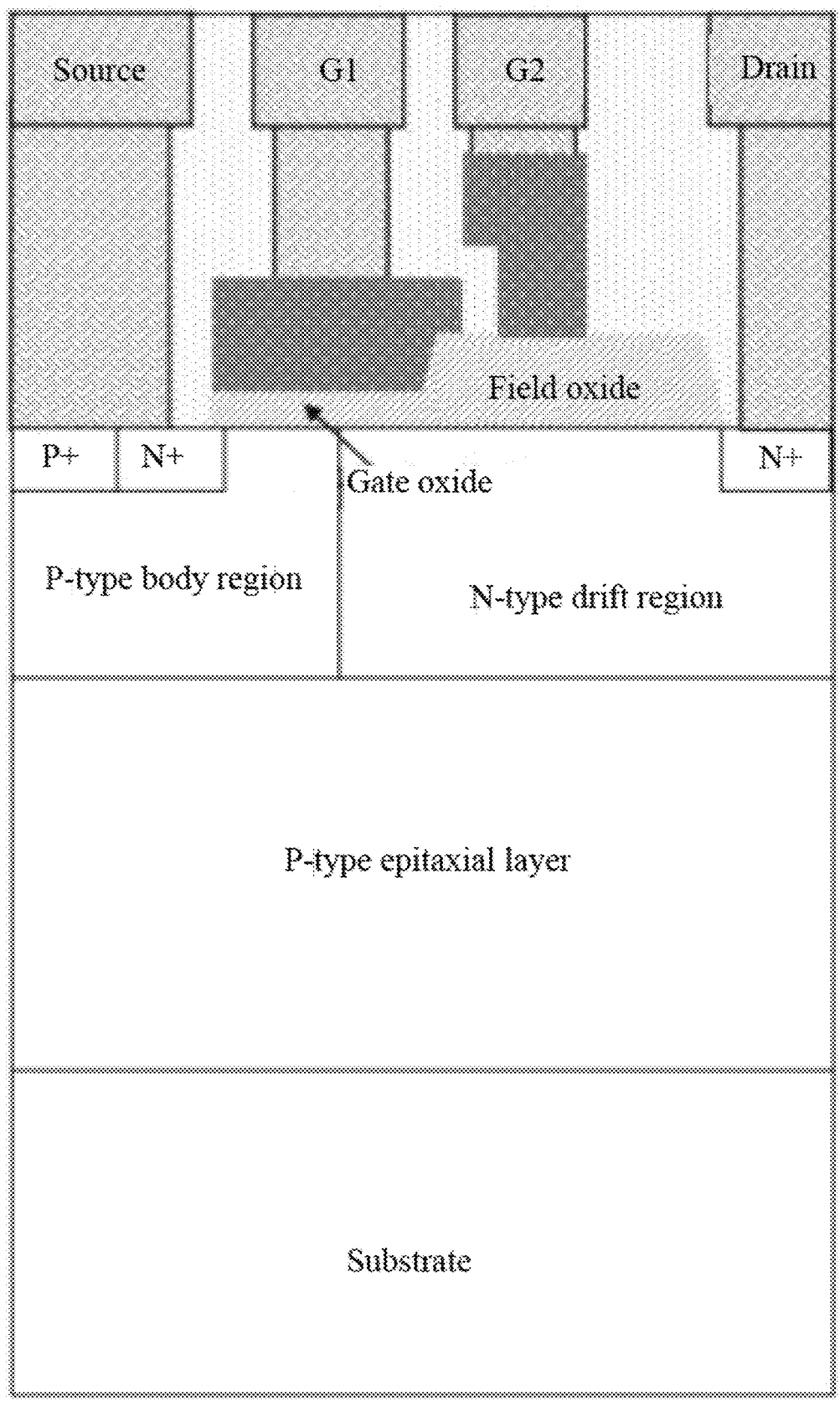
FIG. 6 is a schematic structural diagram of a lateral trench of the transistor according to the embodiments of the disclosure.
Figure 7:
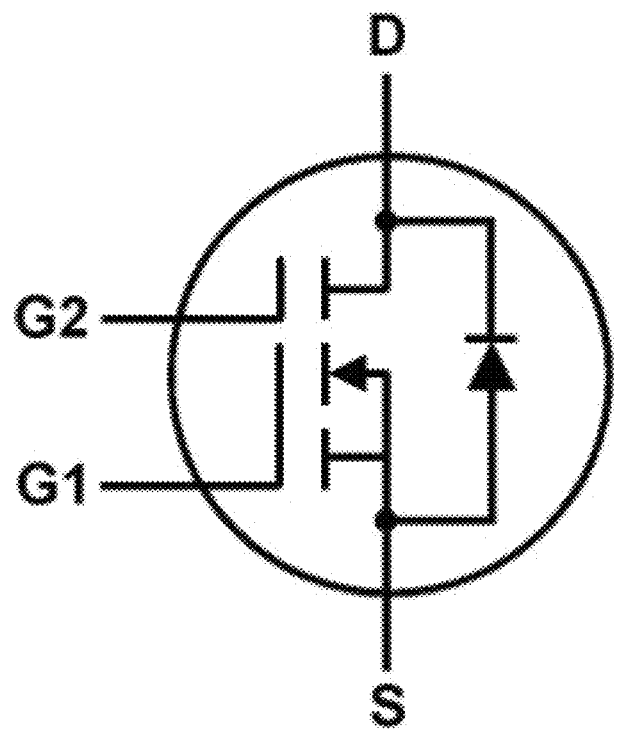
FIG. 7 is a schematic diagram of a circuit symbol of a transistor according to the embodiments of the disclosure.

Specifically, referring to FIG. 5 and FIG. 6, FIG. 5 is a schematic structural diagram of a transistor according to the embodiments of the disclosure, and FIG. 6 is a schematic structural diagram of a transistor according to the embodiments of the disclosure. FIG. 5 shows a vertical trench structure, and FIG. 6 shows a lateral trench structure. It should be noted that the transistors shown in FIG. 5 and FIG. 6 are both N-channels. The transistors in the embodiments of the disclosure may also be P-channels, which are not limited to the disclosure. Referring to FIG. 5 and FIG. 6, the transistor according to the embodiments of the disclosure is provided with a first gate G1 and a second gate G2, where the first gate G1 and the second gate G2 are not connected to each other, the second gate G2 and a source of the transistor are not connected to each other, the first gate G1 is disposed above a channel region of the transistor and is configured to control the channel region, and the second gate G2 is disposed above a field oxide of the transistor and is configured to control a drift region of the transistor. Referring to FIG. 7, FIG. 7 is a schematic symbolic diagram of the transistor according to the embodiments of the disclosure.

It should be noted that FIG. 1 to FIG. 6 all show the schematic diagrams of the internal structures of the transistors when they are not powered on.

Figure 8:
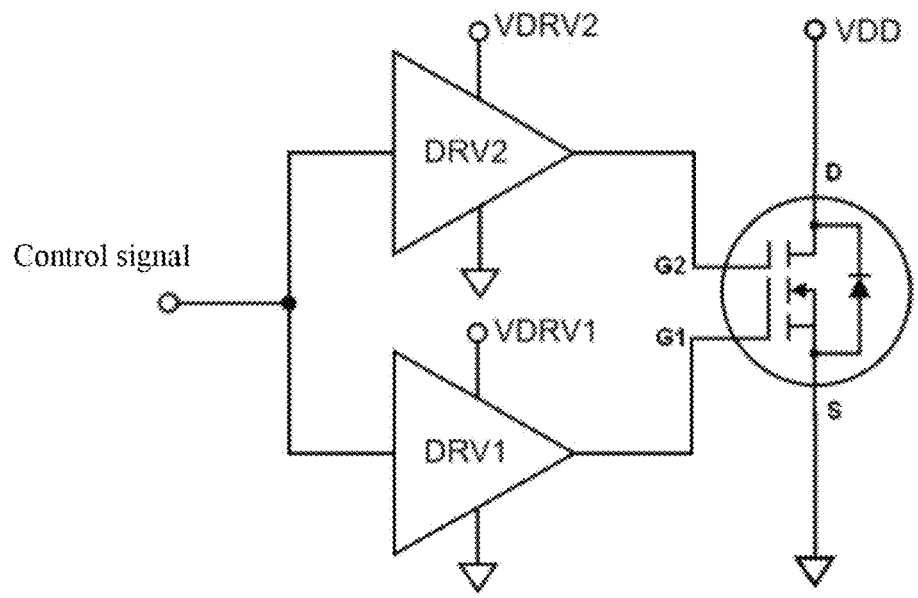
FIG. 8 is a schematic circuit diagram of a low-side switching circuit provided in the embodiments of the disclosure.
Figure 9:
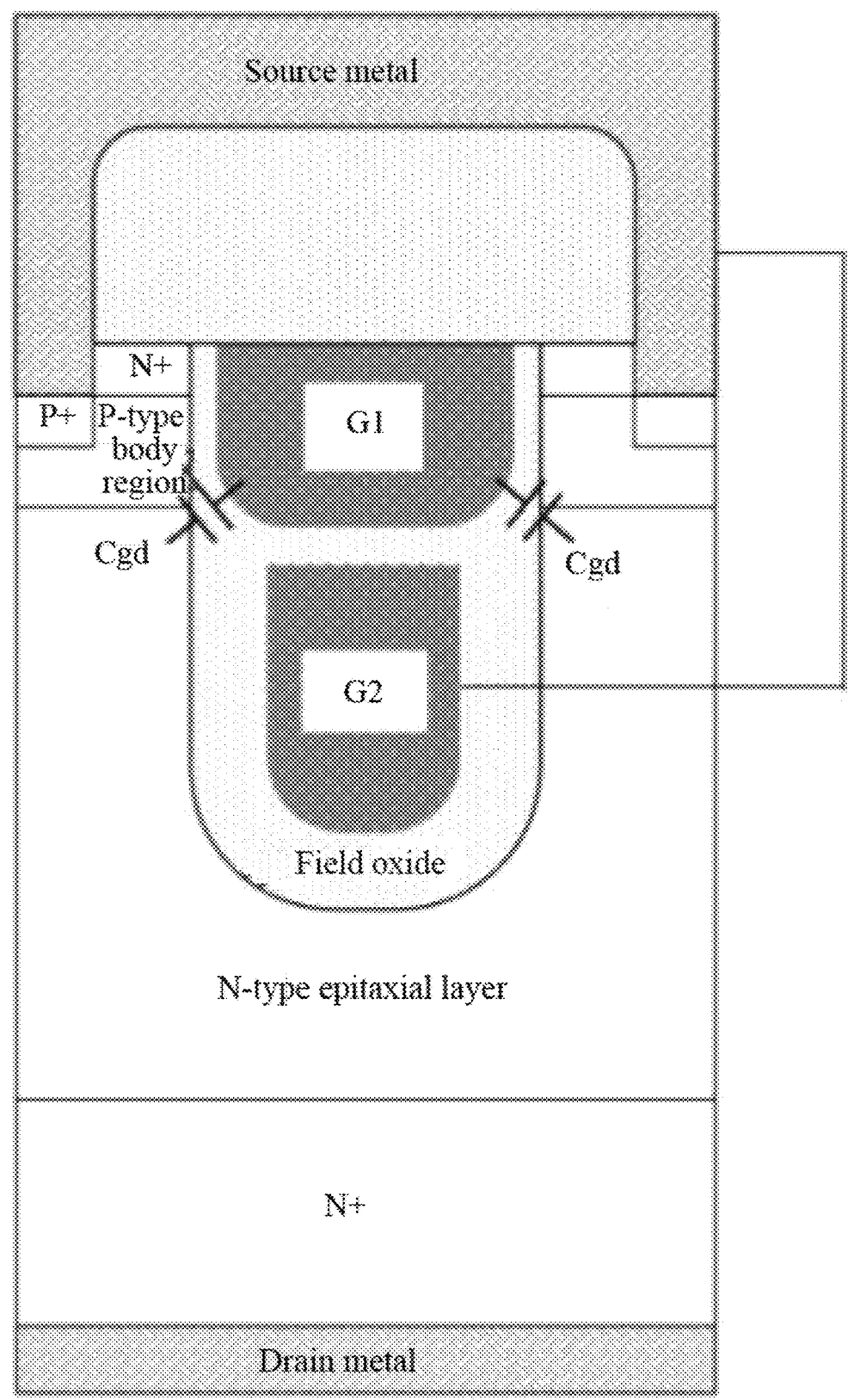
FIG. 9 is a schematic diagram of the internal state of the transistor with the vertical structure according to the embodiments of the disclosure reaching the operating voltage at the first gate and having no voltage at the second gate.
Figure 10:
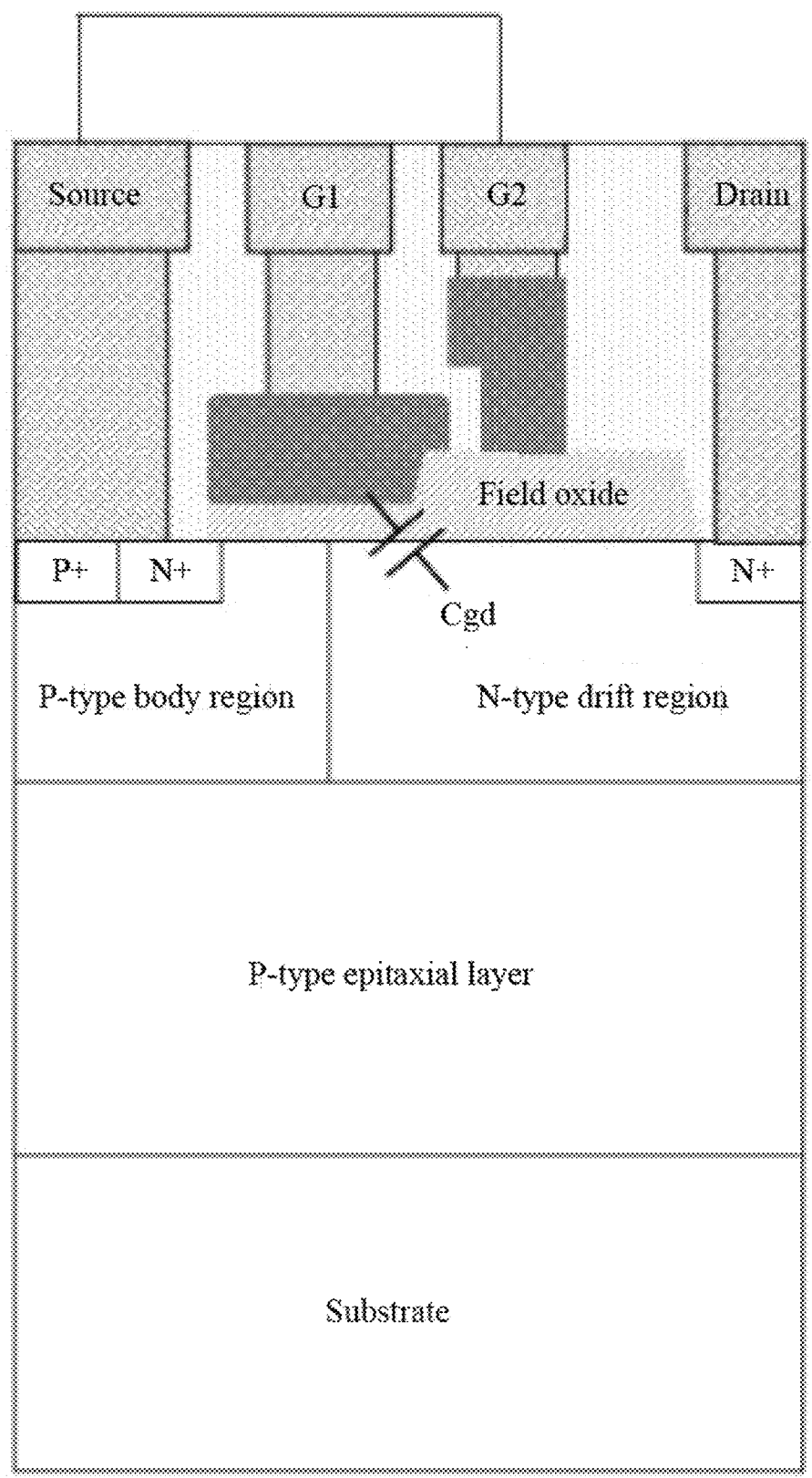
FIG. 10 is a schematic diagram of the internal state of the transistor with the lateral structure according to the embodiments of the disclosure reaching the operating voltage at the first gate and having no voltage at the second gate.
Figure 11:
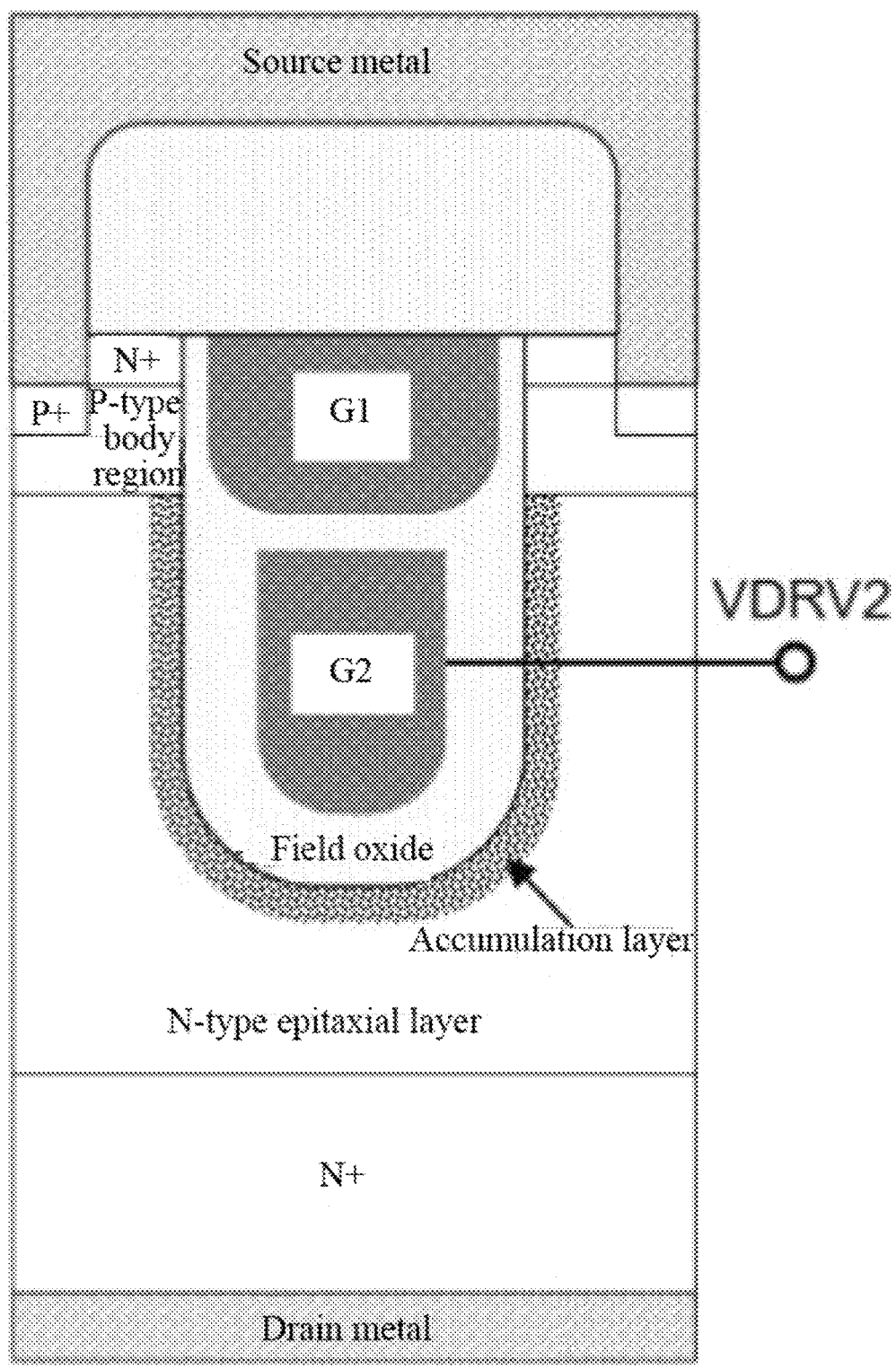
FIG. 11 is a schematic state diagram of the transistor with the vertical structure according to the embodiments of the disclosure when the second gate is connected to the second voltage after the first duration.
Figure 12:
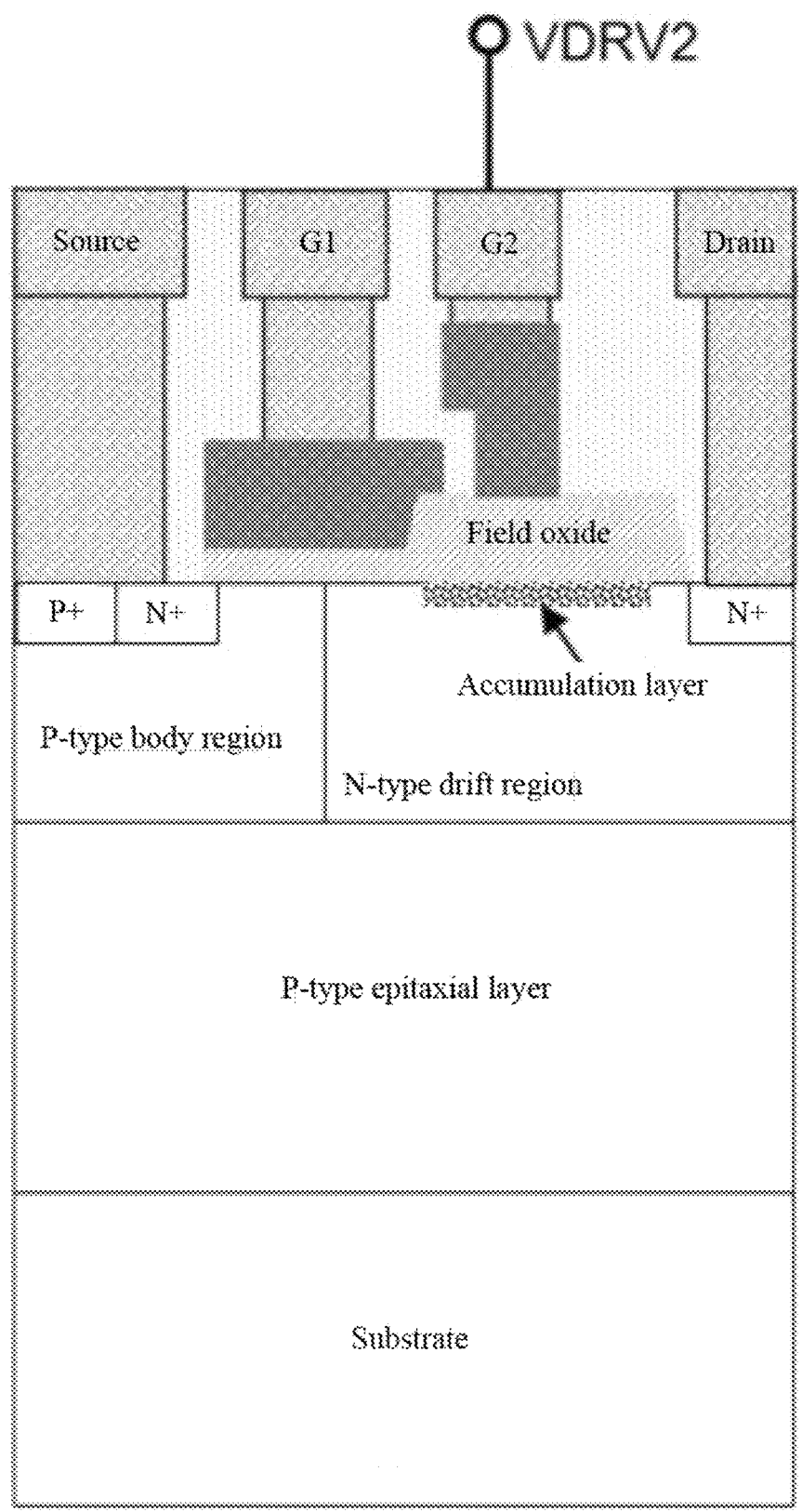
FIG. 12 is a schematic state diagram of the transistor with the lateral structure according to the embodiments of the disclosure when the second gate is connected to the second voltage after the first duration.

The drive circuit according to the embodiments of the disclosure can be applied to a low-side switch. Referring to FIG. 8, FIG. 8 is a schematic circuit diagram of a low-side switching circuit provided in the embodiments of the disclosure. The source of the transistor is grounded, the drain of the transistor is connected to a voltage VDD, the control terminal of the first gate driver DRV1 and the control terminal of the second gate driver DRV2 are both connected to the control signal, the first voltage is VDRV1, and the second voltage is VDRV2. The first gate driver DRV1 and the second gate driver DRV2 can simultaneously receive the control signal. When the first gate driver DRV1 receives the control signal which is at a first level, the first gate driver DRV1 immediately connects the first gate G1 to the first voltage, so that the voltage of the first gate G1 reaches the operating voltage of the first gate G1, and there is no voltage at the second gate G2 at this time. Referring to FIG. 9 and FIG. 10, FIG. 9, and FIG. 10 illustrate schematic diagrams of an internal state of the transistor reaching the operating voltage at the first gate G1 and having no voltage at the second gate G2. The transistor operates from the Miller plateau to the ohmic region in the first duration. Specifically, in the first duration, since the output of the drive circuit of the second gate, G2 is at a low level, the voltage of the second gate G2 is pulled down to the same potential as the source, that is, VGS2=0. Since the voltage of the first gate G1 reaches the operating voltage of the first gate G1, the drain-source current Ids of the transistor gradually increases to the operating current, and the transistor enters the Miller plateau. At this time, the overlapping area of the first gate G1 and the drain is relatively small, so the Miller capacitance of the transistor is relatively small, and the transistor can quickly exit the Miller plateau, thereby increasing the switching speed of the transistor, and reducing the switching loss. As the drain-source voltage Vds of the transistor decreases gradually, the operating state of the transistor enters the ohmic region from the Miller plateau. After the first duration, referring to FIG. 11 and FIG. 12, FIG. 11 and FIG. 12 show the state of the transistor when the second gate G2 is connected to the second voltage after the first duration. At this time, the transistor still operates in the ohmic region, and the second gate driver DRV2 immediately connects the second gate G2 to the second voltage to reach the operating voltage at the second gate G2, so that the second gate G2 controls the drift region of the transistor to form an accumulation layer, and the accumulation layer has a relatively high carrier concentration to reduce resistance components in the drift region, thereby reducing the on-resistance of the transistor, so as to reduce the power consumption of the transistor.

It can be understood that the first duration is longer than or equal to 1 ns. For example, the first duration may be 1 ns or 1.5 ns, as long as the operating state of the transistor enters the ohmic region within the first duration and remains in the ohmic region.

For example, when the first duration is 1 ns, the first gate driver DRV1 and the second gate driver DRV2 can receive the control signal which is at the first level, the first gate driver DRV1 immediately connects the first gate G1 to the first voltage after the control signal is received, while the second gate G2 waits for 1 ns after the control signal is received, and immediately connects the second gate G2 to the second voltage after 1ns.

It is worth noting that the first voltage VDRV1 is the operating voltage of the first gate G1, where VDRV1 is greater than 0 and less than or equal to 10V, for example, 5V or 10V. The second voltage VDRV2 is the operating voltage of the second gate G2, where VDRV2 is greater than or equal to VDRV1 and less than or equal to VDD.

It can be understood that, when the second gate driver DRV2 receives the control signal which is at the second level, the first gate G1 is disconnected from the second voltage. When the first gate driver DRV1 receives the control signal which is at the first level, the first gate G1 is disconnected from the first voltage after a second duration.

Figure 13:
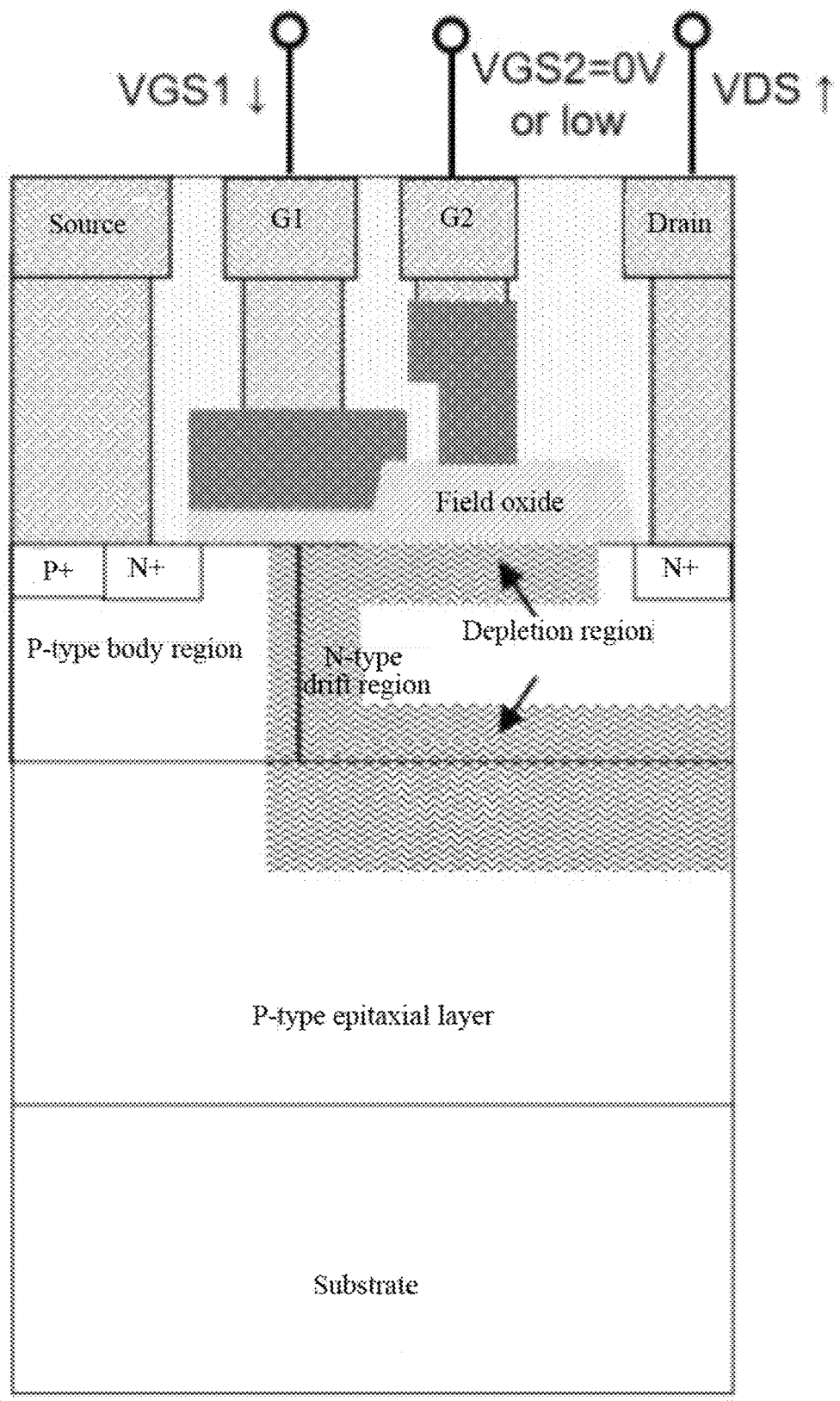
FIG. 13 is a schematic diagram of the depletion region and electric field distribution when the transistor according to the embodiments of the disclosure is turned off and VGS1 is decreasing.
Figure 14:
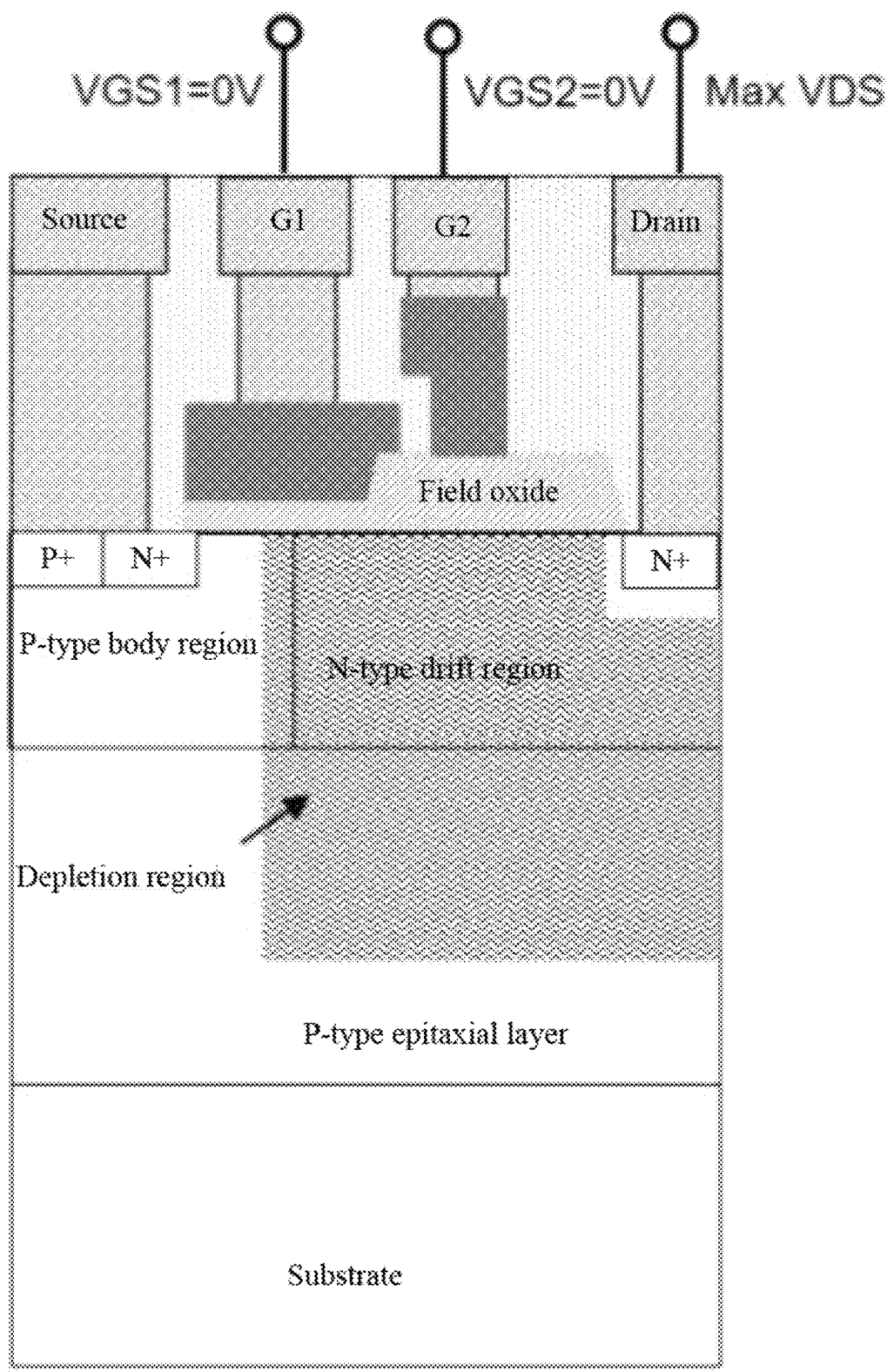
FIG. 14 is a schematic diagram of the depletion region and electric field distribution when the transistor according to the embodiments of the disclosure is turned off and VGS1 is 0.

Specifically, referring to FIG. 13 and FIG. 14, FIG. 13 and FIG. 14 are schematic diagrams of depletion region and electric field distribution when the transistor is turned off. When the transistor is turned off, the control signal is at the second level. The second gate G2 is first disconnected from the second voltage, and in the second duration after the second gate G2 is disconnected from the second voltage, the voltage VGS2 between the second gate G2 and the source gradually decreases, the carriers in the accumulation layer in the drift region are released, and the carriers in the accumulation layer are completely released when VGS2=0V. After the second duration, the first gate G1 is disconnected from the first voltage. As the voltage VGS1 between the first gate G1 and the source drops, the conduction current IDS drops and the drain-source voltage VDS rises, the channel region is gradually closed, and when VGS1=0V, the device is completely turned off, and VDS reaches the highest stable state value. VGS2 should drop to 0V or the low potential significantly lower than VDS before the drain-source voltage VDS of the transistor reaches the highest value, then when VDS is at a relatively high potential, the electric field distribution in the drift region of the device is relatively uniform, the electric field strength is much lower than that of a breakdown critical electric field, and the device has sufficient voltage resistance. At this time, the second gate G2 is a field plate in RESURF (Reduced Surface Field) technology.

It can be understood that the second duration is longer than or equal to 1 ns. For example, the second duration may be 1 ns or 1.5 ns.

It is worth noting that those having ordinary skills in the art may set the first level as a high level or a low level according to actual needs. When the first level is the high level, the second level is the low level; and when the first level is the low level, the second level is the high level.

Figure 15:
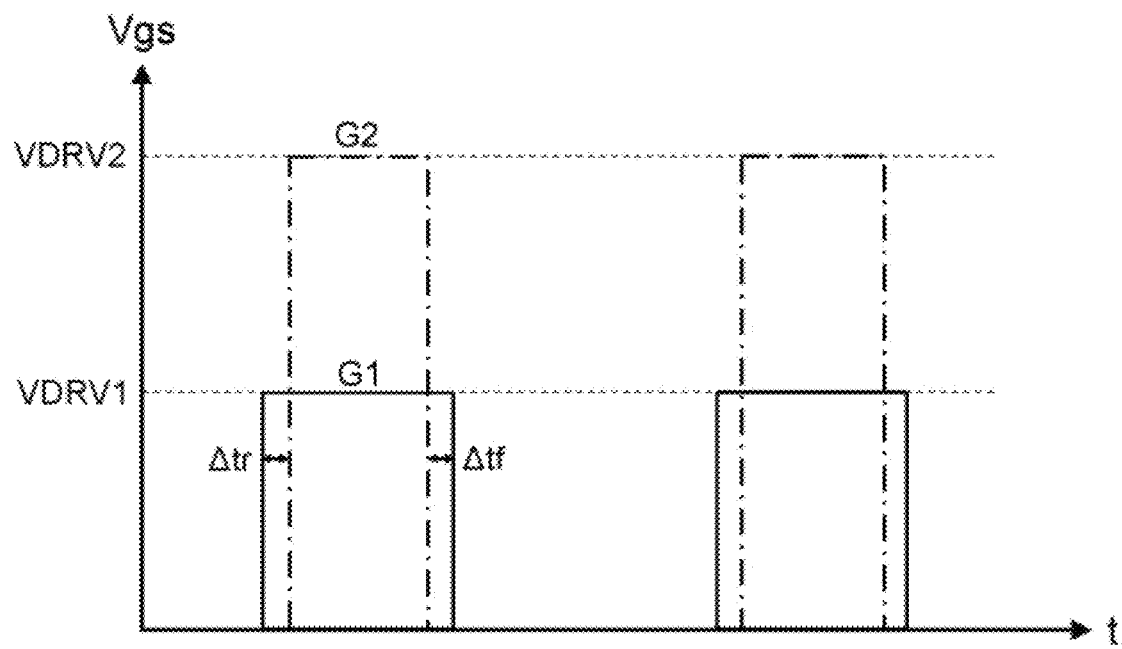
FIG. 15 is a schematic waveform diagram of the voltage between the first gate and the source and the voltage between the second gate and the source according to the embodiments of the disclosure.

It can be understood that, referring to FIG. 15, FIG. 15 is a schematic waveform diagram of the voltage between the first gate G1 and the source and the voltage between the second gate G2 and the source, where Δtr is the first duration, and Δtf is the second duration. In the gate drive circuit for a power semiconductor device according to the embodiments of the disclosure, VDRV1 and VDRV2 may be independently provided by an external power supply or may be generated from an input power supply VIN via internal power supplies such as an LDO, a buck converter, or a boost converter.

It is worth noting that the first gate driver DRV1 and the second gate driver DRV2 may use a gate driver with a delay function, so that when the first gate driver DRV1 receives the control signal which is at the first level, the first gate G1 is disconnected from the first voltage after the second duration, and when the second gate driver DRV2 receives the control signal which is at the first level, the second gate G2 is connected to the second voltage after the first duration.

Figure 16:
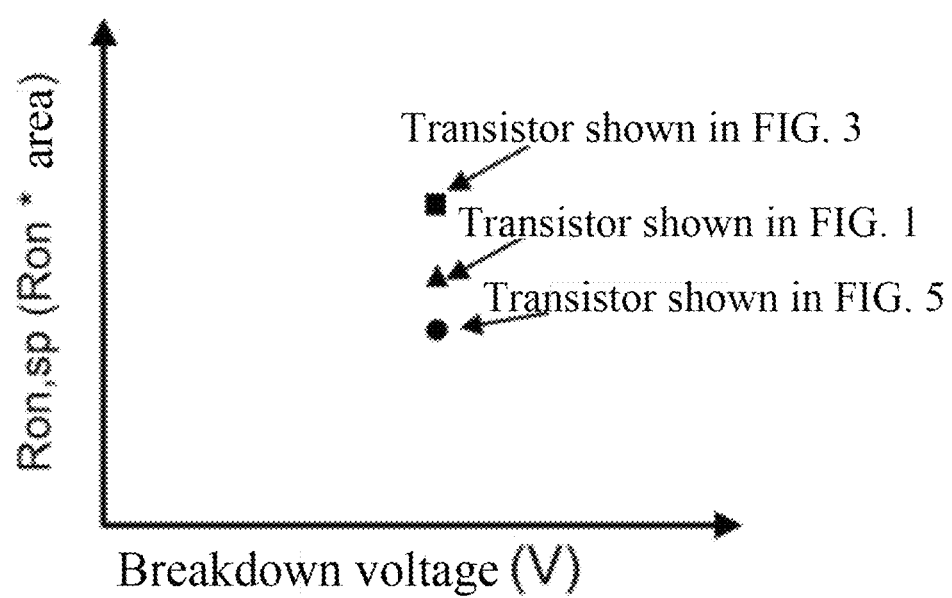
FIG. 16 is a schematic comparison diagram of characteristics between the transistor according to the embodiments of the disclosure and the transistors shown in FIG. 1 and FIG. 3.
Figure 17:
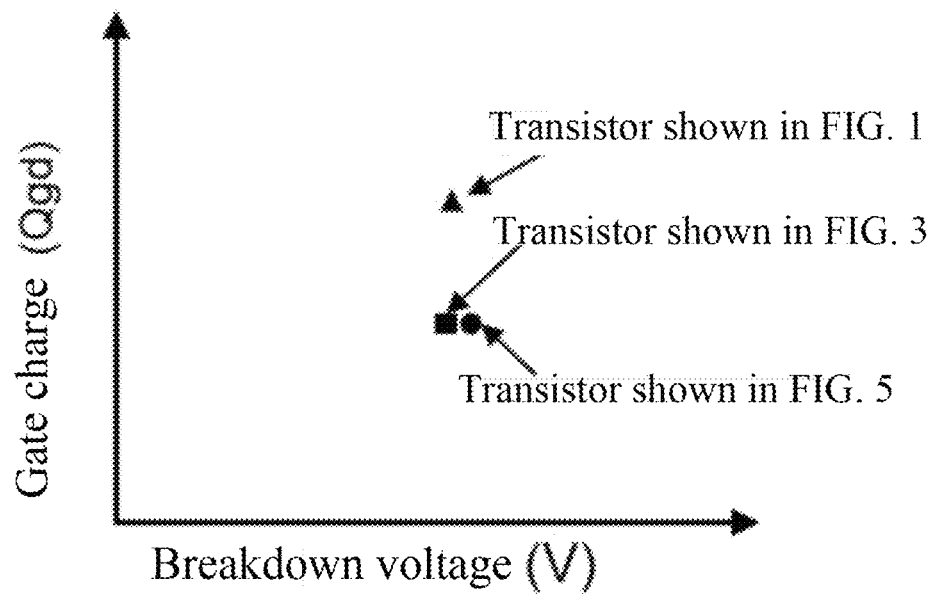
FIG. 17 is a schematic comparison diagram of another characteristic between the transistor according to the embodiments of the disclosure and the transistors shown in FIG. 1 and FIG. 3.

Referring to FIG. 16 which shows the characteristic comparison between the transistor according to the embodiments of the disclosure and the transistors shown in FIG. 1 and FIG. 3, the ordinate is the on-resistance (Ron, sp), and the abscissa is the breakdown voltage BVdss. Referring to FIG. 17 which shows the characteristic comparison between the transistor according to the embodiments of the disclosure and the transistors shown in FIG. 1 and FIG. 3, the ordinate is the gate-drain charge Qgd, and the abscissa is the breakdown voltage BVdss.

It can be understood that when the transistor according to the embodiments of the disclosure is a discrete power device, the rest circuits in the gate drive circuit for the power semiconductor device are independent chips, which may be packaged with the transistor as a whole by means of sealing. When the device used in the disclosure is an integrated power device, the drive circuit and the power device may be fabricated on the same substrate to form a single chip.

It can be understood that the transistors shown in FIG. 5 and FIG. 6 are N-channels, which should not be construed as limiting the disclosure, and the transistors of the disclosure may also be P-channels. The transistors according to the disclosure are not limited to silicon-based power devices, and can also be used in wide bandgap power devices such as GaN and SiC.

Embodiments in the second aspect of the disclosure provide a low-side switching circuit, including the gate drive circuit for a power semiconductor device described in any one of the embodiments in the first aspect, where the source of the transistor is grounded, and the drain of the transistor is connected to an input voltage. For example, the low-side switching circuit according to the disclosure may be a circuit as shown in FIG. 8.

Since the low-side switching circuit according to the embodiments of the second aspect includes the gate drive circuit for a power semiconductor device of any one of the embodiments in the first aspect of the disclosure, the corresponding content of the gate drive circuit for a power semiconductor device in the embodiments mentioned in the first aspect is also applicable to the low-side switching circuit in the embodiments mentioned in the second aspect and has the same implementation principle and technical effect. To avoid redundant description, it will not be described in detail here.

Figure 18:
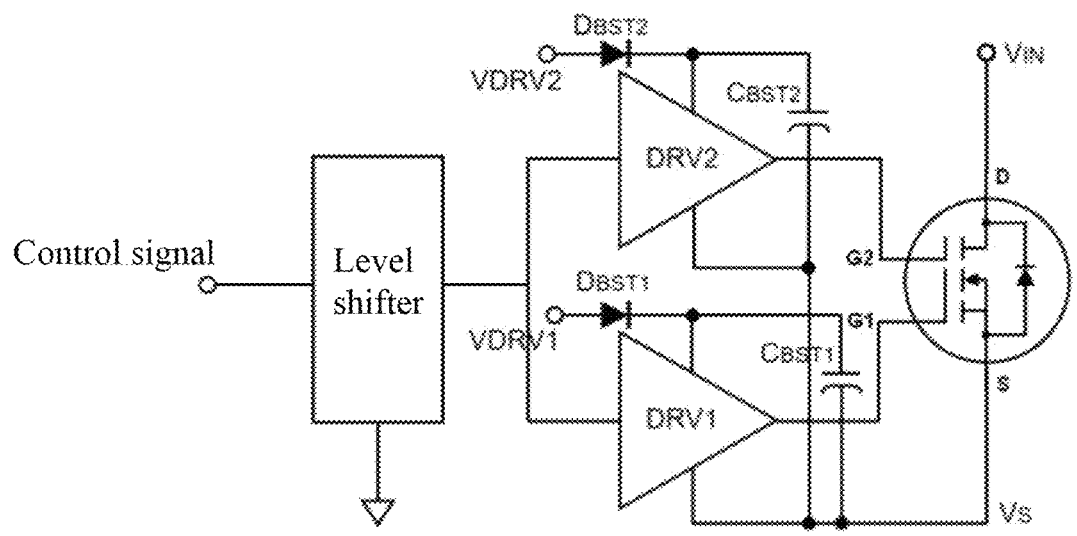
FIG. 18 is a schematic circuit diagram of a high-side switching circuit according to the embodiments of the disclosure.

Referring to FIG. 18, embodiments in the third aspect of the disclosure provide a high-side switching circuit, including the gate drive circuit for a power semiconductor device described in any one of the embodiments in the first aspect, and also including a level shifter, where the control terminal of the first gate driver DRV1 is connected to the control signal through the level shifter and the control terminal of the second gate driver DRV2 is connected to the control signal through the level shifter.

Since the high-side switching circuit according to the embodiments in the third aspect includes the gate drive circuit for a power semiconductor device according to any one of the embodiments in the first aspect of the disclosure, corresponding content of the gate drive circuit for a power semiconductor device in the embodiments mentioned in the first aspect is also applicable to the high-side switching circuit in the embodiments mentioned in the third aspect and has the same implementation principle and technical effect. To avoid redundant description, it will not be described in detail here.

It can be understood that the high-side switching circuit further includes a first bootstrap diode DBST1, a first bootstrap capacitor CBST1, a second bootstrap diode DBST2, and a second bootstrap capacitor CBST2.

An input terminal of the first bootstrap diode DBST1 is connected to the first voltage, an output terminal of the first bootstrap diode DBST1 is electrically connected to a positive terminal of the first bootstrap capacitor CBST1 and the voltage input terminal of the first gate driver, respectively. A negative terminal of the first bootstrap capacitor CBST1 is electrically connected to a high-voltage side floating power return terminal of the first gate driver DRV1, and the high-voltage side floating power return terminal of the first gate driver DRV1 is electrically connected to the source of the transistor. The drain of the transistor is connected to the input voltage. An input terminal of the second bootstrap diode DBST2 is connected to the second voltage, an output terminal of the second bootstrap diode DBST2 is electrically connected to a positive terminal of the second bootstrap capacitor CBST2 and the voltage input terminal of the second gate driver DRV2, respectively. A negative terminal of the second bootstrap capacitor CBST2 is electrically connected to a high-voltage side floating power return terminal of the second gate driver DRV2, and the high-voltage side floating power return terminal of the second gate driver DR V2 is electrically connected to the source of the transistor.

Embodiments in the fourth aspect of the disclosure provide a gate drive method for a power semiconductor device, applied to the gate drive circuit for a power semiconductor device according to the embodiments in the first aspect, the drive method includes the following steps:

when the control signal which is at a first level is received, controlling the first gate driver DRV1 to connect the first gate G1 to the first voltage, so as to make the first gate G1 control the channel region, so that in a first duration, the transistor first enters a Miller plateau, and then enters an ohmic region from the Miller plateau; and controlling the second gate driver DRV2 to connect the second gate G2 to the second voltage after the first duration, so that the second gate G2 controls the drift region of the transistor to form an accumulation layer.

When the first gate driver DRV1 receives the control signal which is at the first level, the first gate driver DRV1 connects the first gate G1 to the first voltage, while the voltage of the second gate G2 does not reach the operating voltage at this time. Only the voltage of the first gate G1 of the transistor reaches the operating voltage, which makes the first gate G1 control the channel region, so that when operating in the first duration, the transistor first enters a Miller plateau, and then enters an ohmic region from the Miller plateau. When the transistor operates on the Miller plateau, the area of an overlapping region between the first gate G1 and the drain inside the transistor is relatively small, so the Miller capacitance of the transistor is relatively small, thereby improving the switching speed of the transistor. When the second gate driver DRV2 receives the control signal which is at the first level, the second gate G2 is connected to the second voltage after the first duration, and the voltage of the second gate G2 reaches the operating voltage at this time, so that the second gate G2 controls the drift region of the transistor to form the accumulation layer, and the accumulation layer has a relatively high carrier concentration to reduce resistance components in the drift region, thereby reducing the on-resistance of the transistor, so as to reduce the power consumption of the transistor. Therefore, by using the gate drive circuit for a power semiconductor device according to the embodiments of the disclosure, the switching speed of transistors can be improved, and the on-resistance of transistors can be reduced.

According to some embodiment in the fourth aspect of the disclosure, the drive method further includes the following steps:

when the control signal which is at a second level is received, controlling the second gate driver DRV2 to disconnect the second gate G2 from the second voltage; and controlling the first gate driver DRV1 to disconnect the first gate G1 from the first voltage after the first duration.

According to some embodiment in the fourth aspect of the disclosure, the first duration is longer than or equal to 1 ns, and the second duration is longer than or equal to 1 ns.

The embodiments of the disclosure have been described in detail above in conjunction with the accompanying drawing, but the disclosure is not limited to the above-mentioned embodiments. Within the scope of knowledge possessed by those of ordinary skill in the art, various changes can also be made without departing from the purpose of the disclosure. In addition, the embodiments of the disclosure and the features in the embodiments can be combined with each other to derive other embodiments not explicitly described.

What is claimed is:

1. A gate drive circuit for a power semiconductor device, comprising:
   a power semiconductor device, wherein the power semiconductor device is a transistor that is provided with a first gate and a second gate, the first gate and the second gate are not connected to each other, the second gate and a source of the transistor are not connected to each other, the first gate is disposed above a channel region of the transistor and is configured to control the channel region, and the second gate is disposed above a field oxide of the transistor and is configured to control a drift region of the transistor;
   a first gate driver, wherein a control terminal of the first gate driver is configured to connect a control signal, a voltage input terminal of the first gate driver is connected to a first voltage, a voltage output terminal of the first gate driver is electrically connected to the first gate, and the first voltage is an operating voltage of the first gate; and
   a second gate driver, wherein a control terminal of the second gate driver is configured to connect the control signal, a voltage input terminal of the second gate driver is connected to a second voltage, a voltage output terminal of the second gate driver is electrically connected to the second gate, and the second voltage is an operating voltage of the second gate;
   when the first gate driver receives the control signal which is at a first level, the first gate is connected to the first voltage to make the first gate control the channel region, so that in a first duration, the transistor first enters a Miller plateau, and then enters an ohmic region from the Miller plateau; and
   when the second gate driver receives the control signal which is at the first level, the second gate is connected to the second voltage after the first duration, so that the second gate controls the drift region of the transistor to form an accumulation layer.

2. The gate drive circuit for a power semiconductor device of claim 1, wherein the first duration is longer than or equal to 1 ns.

3. The gate drive circuit for a power semiconductor device of claim 1, wherein when the second gate driver receives the control signal which is at a second level, the second gate is disconnected from the second voltage; and
   when the first gate driver receives the control signal which is at the second level, the first gate is disconnected from the first voltage after a second duration.

4. The gate drive circuit for a power semiconductor device of claim 3, wherein the second duration is longer than or equal to 1 ns.

5. A low-side switching circuit, comprising the gate drive circuit for a power semiconductor device of claim 1, wherein a source of the transistor is grounded, and a drain of the transistor is connected to an input voltage.

6. A high-side switching circuit, comprising the gate drive circuit for a power semiconductor device of claim 1, and further comprising a level shifter, wherein the control terminal of the first gate driver is connected to the control signal through the level shifter and the control terminal of the second gate driver is connected to the control signal through the level shifter.

7. The high-side switching circuit of claim 6, further comprising a first bootstrap diode, a first bootstrap capacitor, a second bootstrap diode, and a second bootstrap capacitor, wherein an input terminal of the first bootstrap diode is connected to the first voltage, an output terminal of the first bootstrap diode is electrically connected to a positive terminal of the first bootstrap capacitor and the voltage input terminal of the first gate driver, respectively, a negative terminal of the first bootstrap capacitor is electrically connected to a high-voltage side floating power return terminal of the first gate driver, and the high-voltage side floating power return terminal of the first gate driver is electrically connected to the source of the transistor; the drain of the transistor is connected to the input voltage; and an input terminal of the second bootstrap diode is connected to the second voltage, an output terminal of the second bootstrap diode is electrically connected to a positive terminal of the second bootstrap capacitor and the voltage input terminal of the second gate driver, respectively, a negative terminal of the second bootstrap capacitor is electrically connected to a high-voltage side floating power return terminal of the second gate driver, and the high-voltage side floating power return terminal of the second gate driver is electrically connected to the source of the transistor.

8. A gate drive method for a power semiconductor device, applied to the gate drive circuit for a power semiconductor device of claim 1, the drive method comprising:
   in response to the control signal which is at a first level being received, controlling the first gate driver to connect the first gate to the first voltage, so as to make the first gate control the channel region so that in a first duration, the transistor first enters a Miller plateau, and then enters an ohmic region from the Miller plateau; and controlling the second gate driver to connect the second gate to the second voltage after the first duration, so that the second gate controls the drift region of the transistor to form an accumulation layer.

9. The gate drive method for a power semiconductor device of claim 8, further comprising:

in response to the control signal which is at a second level is received, controlling the second gate driver to disconnect the second gate from the second voltage; and controlling the first gate driver to disconnect the first gate from the first voltage after a second duration.

10. The gate drive method for a power semiconductor device of claim 9, wherein the first duration is longer than or equal to 1 ns.

* * * * *